(12) United States Patent
Filippi et al.

(10) Patent No.: US 7,683,644 B2
(45) Date of Patent: Mar. 23, 2010

(54) EXTRUSION FAILURE MONITOR STRUCTURES

(75) Inventors: Ronald G. Filippi, Wappingers Falls, NY (US); James R. Lloyd, Jr., Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 184 days.

(21) Appl. No.: 11/834,054

(22) Filed: Aug. 6, 2007

(65) Prior Publication Data

US 2009/0039896 A1    Feb. 12, 2009

(51) Int. Cl.
*G01R 27/26*    (2006.01)
*G01R 27/08*    (2006.01)
*G01N 27/60*    (2006.01)

(52) U.S. Cl. .................. 324/719; 324/663; 324/720; 324/455

(58) Field of Classification Search .......... 324/719, 324/720, 663, 455
See application file for complete search history.

(56) References Cited

U.S. PATENT DOCUMENTS

| | | | | |
|---|---|---|---|---|
| 4,755,744 A | * | 7/1988 | Moore et al. | 324/700 |
| 6,320,391 B1 | * | 11/2001 | Bui | 324/537 |
| 6,598,182 B1 | * | 7/2003 | Lowitz et al. | 714/39 |
| 6,768,323 B1 | | 7/2004 | Hau-Riege et al. | |
| 6,909,293 B2 | | 6/2005 | Kim | |
| 6,929,963 B1 | * | 8/2005 | Kim | 438/11 |
| 7,119,545 B2 | | 10/2006 | Ahsan et al. | |

* cited by examiner

*Primary Examiner*—Timothy J Dole
*Assistant Examiner*—Farhana Hoque
(74) *Attorney, Agent, or Firm*—Schmeiser, Olsen & Watts; Louis J. Percello

(57) ABSTRACT

A structure and method for monitoring extrusion failures. The structure includes: a test wire having first and second ends; first and second vias contacting first and second ends of the test wire; a first monitor structure electrically isolated from the test wire and surrounding a periphery of the test wire; and a second monitor structure over the test wire, the second monitor structure electrically isolated from the test wire, the second monitor structure extending over at least the first end of the test wire.

20 Claims, 14 Drawing Sheets

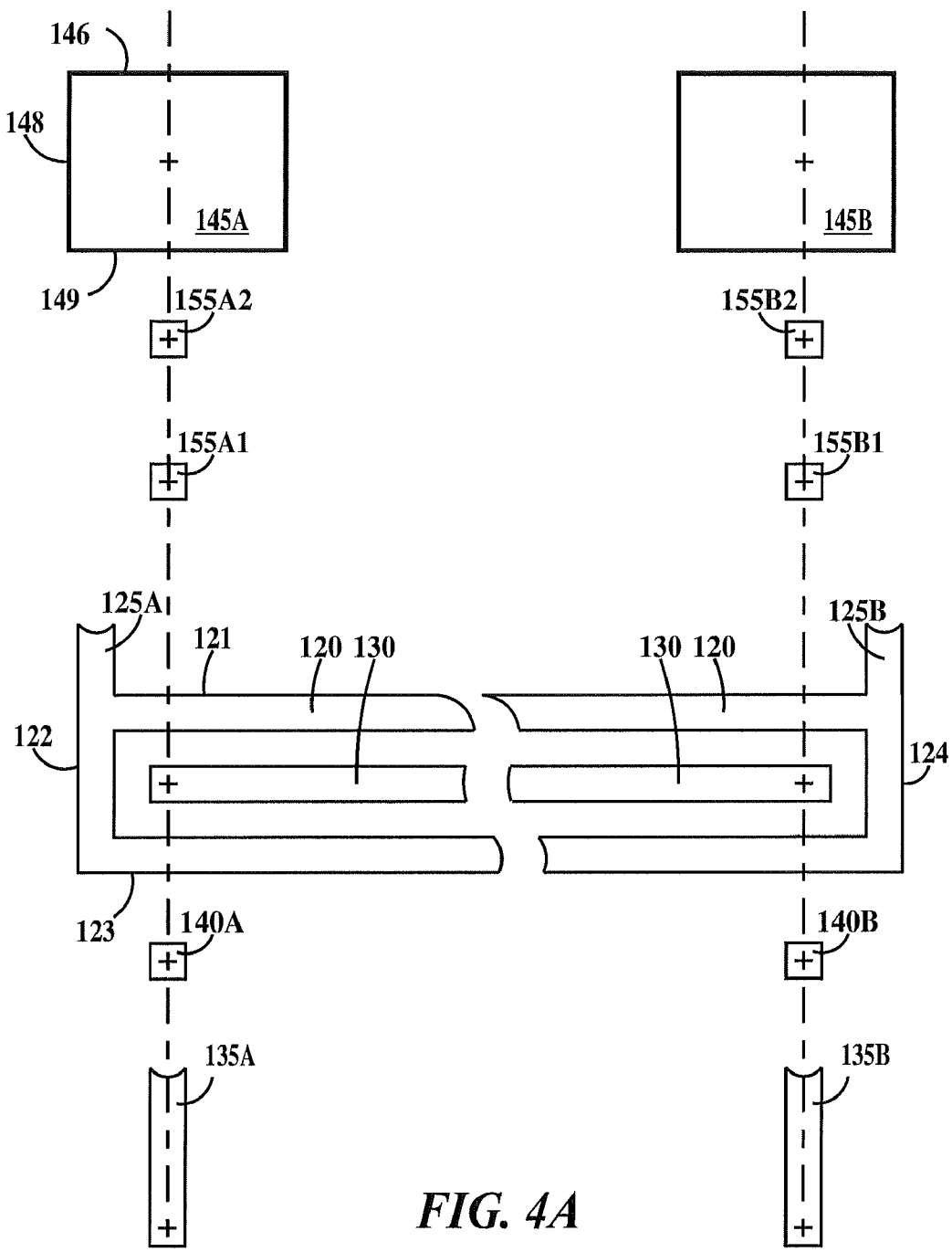
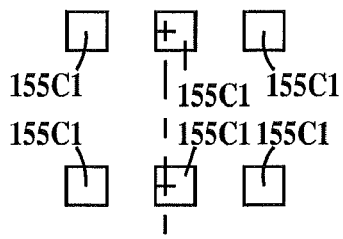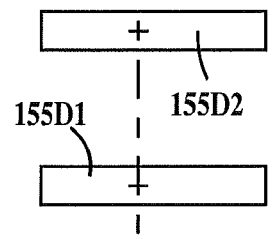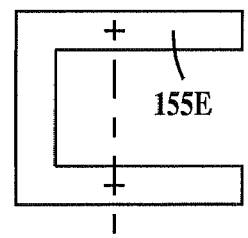
FIG. 4A
FIG. 4B     FIG. 4C     FIG. 4D

EXTRUSION FAILURE MONITOR STRUCTURES

FIELD OF THE INVENTION

The present invention relates to the field of integrated circuits; more specifically, it relates to methods and structures for detection of metal extrusions associated with electromigration in high-current density settings.

BACKGROUND OF THE INVENTION

In modern integrated circuits, devices such as transistors formed in a semiconductor substrate are interconnected by wires formed in interlevel dielectric (ILD) layers into circuits. At high current densities, the metal in the wires can migrate in the direction of electron flow building up at the anode end of the wire to the point where the buildup of metal causes delamination of the interlevel dielectric layers and extrusion of metal from the end of the wire. These extrusions can short to adjacent wires causing circuit failures. The remedy is to make wires wider and/or thicker to reduce current density, however wider lines use more integrated circuit chip real estate and makes dense wiring schemes more difficult if not impossible. The data gathered from extrusion monitors enables the use of wires of minimum wire cross-sectional areas in the integrated circuit.

Currently, the industry uses electromigration or extrusion test structures to monitor this failure mechanism. However, current monitors only can detect fails, which extend laterally to adjacent wires in the same ILD layer. However, extrusions that extend vertically and short to wires in upper or lower ILD layers are not detected. Therefore, there is a need for an extrusion monitor that can detect vertical as well as lateral extrusions.

SUMMARY OF THE INVENTION

A first aspect of the present invention is a structure, comprising: an electrically conductive test wire formed in a first dielectric layer over a top surface of a substrate, a bottom surface of the test wire facing the top surface of the substrate, the test wire having first and second ends, a top surface of the test wire opposite the bottom surface of the test wire; an electrically conductive first monitor structure formed in the first dielectric layer, a bottom surface of the first monitor structure facing the top surface of the substrate, the first monitor structure electrically isolated from the test wire, the first monitor structure surrounding a periphery of the test wire; an electrically conductive second monitor structure formed in a second dielectric layer over the first dielectric layer, a bottom surface of the second monitor structure facing a top surface of the test wire, the second monitor structure electrically isolated from the test wire, the second monitor structure extending over the first end of the test wire; and electrically conductive first and second vias either (i) located between the top surface of the substrate and the test wire, the first via physically and electrically contacting the bottom surface of the test wire at the first end and the second via physically and electrically contacting the bottom surface of the test wire at the second end or (ii) located between the test wire and the second monitor structure, the first via physically and electrically contacting the top surface of the test wire at the first end and the second via physically and electrically contacting the top surface of the test wire at the second end.

A second aspect of the present invention is a method, comprising: forming an electrically conductive test wire formed in a first dielectric layer over a top surface of a substrate, a bottom surface of the test wire facing the top surface of the substrate, the test wire having first and second ends, a top surface of the test wire opposite the bottom surface of the test wire; forming an electrically conductive first monitor structure formed in the first dielectric layer, a bottom surface of the first monitor structure facing the top surface of the substrate, the first monitor structure electrically isolated from the test wire, the first monitor structure surrounding a periphery of the test wire; forming an electrically conductive second monitor structure formed in a second dielectric layer over the first dielectric layer, a bottom surface of the second monitor structure facing a top surface of the test wire, the second monitor structure electrically isolated from the test wire, the second monitor structure extending over the first end of the test wire; and forming electrically conductive first and second vias either (i) located between the top surface of the substrate and the test wire, the first via physically and electrically contacting the bottom surface of the test wire at the first end and the second via physically and electrically contacting the bottom surface of the test wire at the second end or (ii) located between the test wire and the second monitor structure, the first via physically and electrically contacting the top surface of the test wire at the first end and the second via physically and electrically contacting the top surface of the test wire at the second end.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 4A is an exploded top view of the electrically conductive structures in each ILD layer of the extrusion monitor of FIGS. 3A, 3B, 3C and 3D;

FIGS. 4B, 4C and 4D are top views of alternative constructions for a layer of the extrusion monitor illustrated in FIG. 4A;

DETAILED DESCRIPTION OF THE INVENTION

Descriptions of electromigration extrusions and the mechanism of electromigration extrusions are given in U.S. Pat. No. 7,119,545 to Ahsan et al., which is hereby included by reference in its entirety.

Figure 1A:
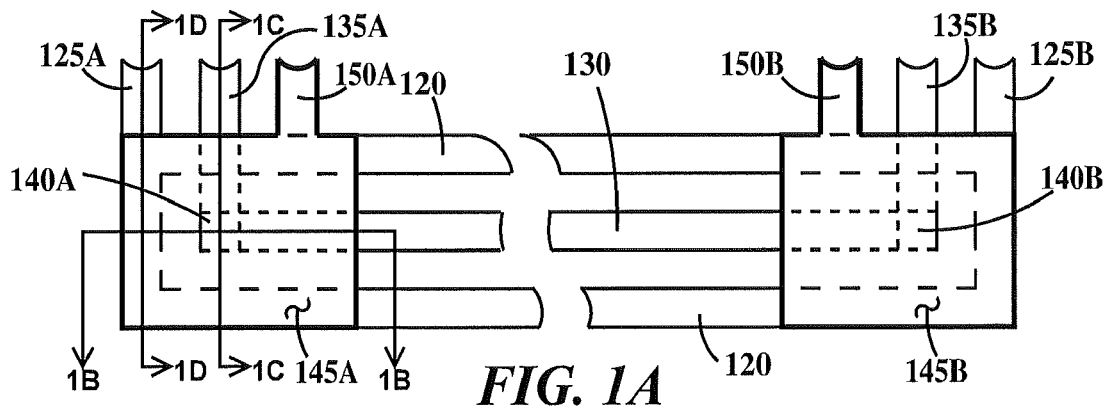
FIG. 1A is a top view and FIGS. 1B, 1C and 1D are cross sectional views through respective lines 1B-1B, 1C-1C and 1D-1D of an extrusion monitor structure according to a first embodiment of the present invention.
Figure 1B:
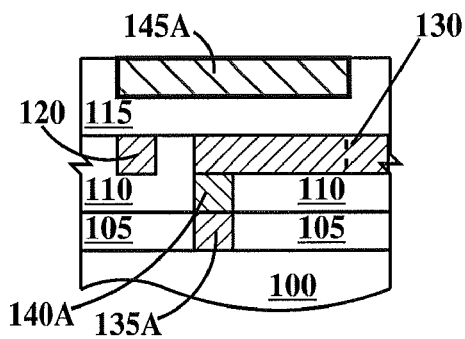
Figure 1C:
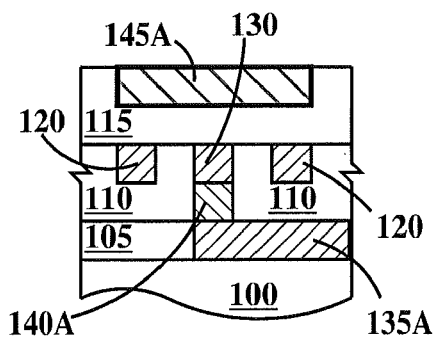
Figure 1D:
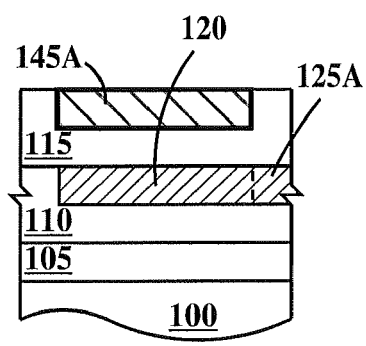

FIG. 1A is a top view and FIGS. 1B, 1C and 1D are cross sectional views through respective lines 1B-1B, 1C-1C and 1D-1D of an extrusion monitor structure according to a first embodiment of the present invention. In FIGS. 1A, 1B, 1C and 1D, formed on a top surface of a substrate 100 is a first interlevel dielectric layer (ILD) 105, formed on a top surface of the first ILD layer is a second ILD layer 110 and formed on a top surface of the second ILD layer is a third ILD layer 115. Formed in second ILD layer 110 is an electrically conductive and rectangular ring-shaped first extrusion monitor structure 120 having integrally formed connector wires 125A and 125B at opposite ends of the ring. First extrusion monitor 120 completely surrounds a perimeter of an electromigration test wire 130 also formed in second ILD layer 110. Electrically conductive wires 135A and 135B formed in first ILD layer 105 are connected to opposite ends of electromigration test wire 130 through respective vias 140A and 140B formed in second ILD layer 110. Formed in third ILD layer 115 are second and third extrusion monitor structures 145A and 145B formed over respective opposite ends of electromigration test wire 130 and having integrally formed connector wires 150A and 150B.

In one example, wires 135A and 135B, vias 140A and 140B, test wire 130 and first, second and third extrusion monitors 120, 145A and 145B are damascene structures. In one example, test wire 130 and vias 140A and 140B are dual damascene structures and wires 135A and 135B, and first, second and third extrusion monitors 120, 145A and 145B are damascene structures.

A damascene process is one in which wire trenches or via openings are formed in a dielectric layer, an electrical conductor of sufficient thickness to fill the trenches is deposited on a top surface of the dielectric, and a chemical-mechanical-polish (CMP) process is performed to remove excess conductor and make the surface of the conductor co-planar with the surface of the dielectric layer to form damascene wires (or damascene vias). When only a trench and a wire (or a via opening and a via) is formed the process is called single-damascene.

A dual-damascene process is one in which via openings are formed through the entire thickness of a dielectric layer followed by formation of trenches part of the way through the dielectric layer in any given cross-sectional view. All via openings are intersected by integral wire trenches above and by a wire trench below, but not all trenches need intersect a via opening. An electrical conductor of sufficient thickness to fill the trenches and via opening is deposited on a top surface of the dielectric and a CMP process is performed to make the surface of the conductor in the trench co-planar with the surface of the dielectric layer to form dual-damascene wires and dual-damascene wires having integral dual-damascene vias.

In either damascene or dual damascene wires, the conductor may be formed by forming a liner (i.e. a conformal layer that does not fill the trench) on the sidewalls and bottom of the trench and filling the remaining space in the trench with a core conductor.

In one example, wires 135A and 135B, vias 140A and 140B, test wire 130 and first, second and third extrusion monitors 120, 145A and 145B may comprise gold (Au), aluminum (Al), copper (Cu), silver (Ag), alloys of Au, alloys of Al, alloys of Cu, alloys of Ag, tantalum (Ta), tantalum nitride (TaN), titanium (Ti), titanium nitride (TiN) or combinations thereof. Wires 135A and 135B, vias 140A and 140B, test wire 130 and first, second and third extrusion monitors 120, 145A and 145B may comprise a liner of TiN on a liner of Ti on a core of Al or may comprise a liner of Ta on a liner of TaN on a core of Cu.

In one example, ILD layers 105, 110, and 115 independently comprise a material selected from the group consisting of silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) NBLok (SiC(N,H)) or combinations thereof. In one example, ILD layers 105, 110, and 115 independently comprise low K (dielectric constant) material selected from the group consisting of hydrogen silsesquioxane polymer (HSQ), methyl silsesquioxane polymer (MSQ), SiLK™ (polyphenylene oligomer) manufactured by Dow Chemical, Midland, Tex., Black Diamond™ (methyl doped silica or $SiO_x(CH_3)_y$ or $SiC_xO_yH_y$ or SiOCH) manufactured by Applied Materials, Santa Clara, Calif., organosilicate glass (SiCOH), and porous SiCOH, other low K materials and combinations thereof. A low K dielectric material has a relative permittivity of less than 4.0.

A horizontal direction is a direction in a plane parallel to a top surface of substrate 100 and a vertical direction is a direction perpendicular to the top surface of the substrate. Horizontal extrusions of sufficient length extending from an end of test line 130 will short to first extrusion monitor 120 and vertical extrusions of sufficient length extending from an end of test line 130 will short to second or third extrusion monitors 145A or 145B. In use, while a current is forced through test line 130 a leakage current between test line 130 and first extrusion monitor 120, second extrusion monitor 145A and third extrusion monitor 145B is measured. When an extrusion short occurs, there is a dramatic increase in the leakage current. Leakage currents between each of first, second and third extrusion monitors 120, 145A and 145B may be monitored separately, individually or in combination.

Figure 2:
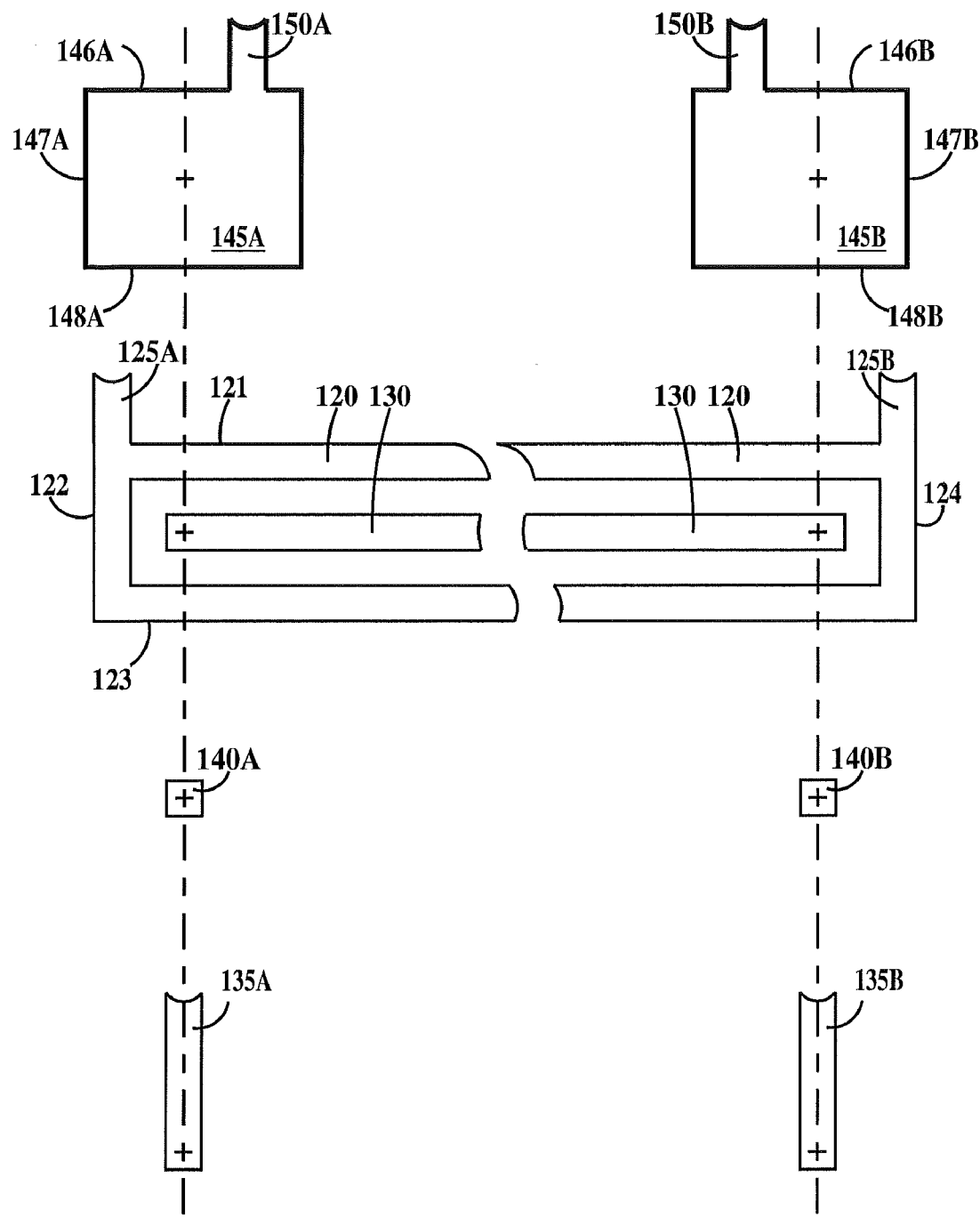
FIG. 2 is an exploded top view of the electrically conductive structures in each ILD layer of the extrusion monitor of FIGS. 1A, 1B, 1C and 1D.

FIG. 2 is an exploded top view of the electrically conductive structures in each ILD layer of the extrusion monitor of FIGS. 1A, 1B, 1C and 1D. In all exploded views described in the present invention, conductive structures are shown in order from an uppermost structure (top of the drawing) furthest from the substrate to a lowermost structure (bottom of the page) closest to the substrate and the dashed lines and crosses indicate how the conductive structures are aligned to each other. In FIG. 2, wires 135A and 135B, vias 140A and 140B, test wire 130 and first, second and third extrusion monitors 120, 145A and 145B are aligned to each other. In one example, edges 146A, 147A and 148A of second extrusion monitor 145A are aligned to the top surface of substrate 100 directly over respective edges 121, 122 and 123 of first extrusion monitor 120 and edges 146B, 147B and 148B of third extrusion monitor 145B are aligned directly over respective edges 121, 124 and 123 of first extrusion monitor 120 when viewed from FIG. 1A. Note edges 121 are aligned to both edges 146A and 146B and edges 123 are aligned to both edges 148A and 148B. Edge to edge alignment of vertically stacked structures is defined by edges of the stacked structures being in a same plane that is perpendicular to the top surface of the substrate on which the structures are stacked. Alternatively, any or all of edges 146A, 147A, 148A, 146B, 147B and 148B may extend past respective edges 121, 122, 123 and 124 when viewed from FIG. 1A.

Figure 3A:
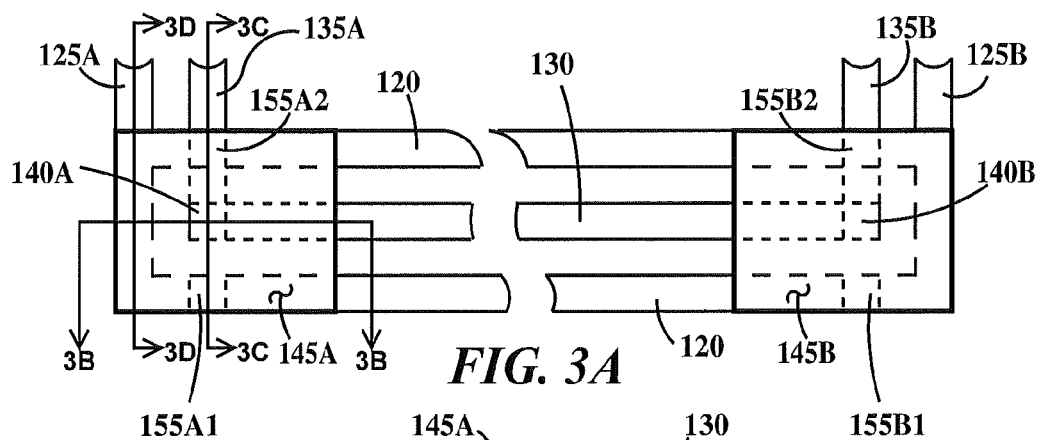
FIG. 3A is a top view and FIGS. 3B, 3C and 3D are cross sectional views through respective lines 3B-3B, 3C-3C and 3D-3D of an alternative wiring scheme for the extrusion monitor structure according to the first embodiment of the present invention.
Figure 3B:
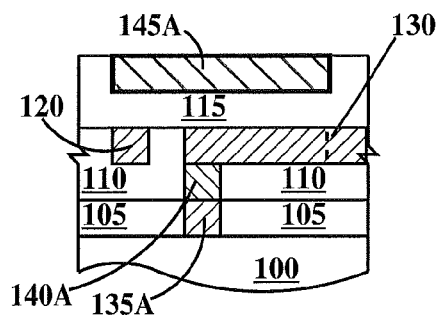
Figure 3C:
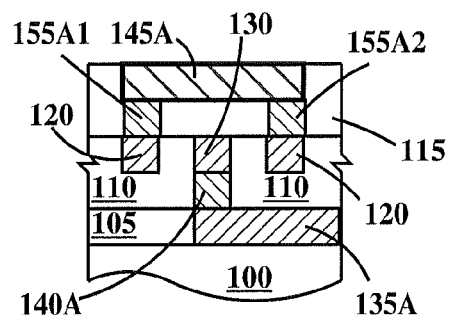
Figure 3D:
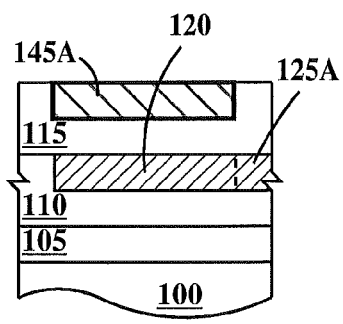

FIG. 3A is a top view and FIGS. 3B, 3C and 3D are cross sectional views through respective lines 3B-3B, 3C-3C and 3D-3D of an alternative wiring scheme for the extrusion monitor structure according to the first embodiment of the present invention. In FIGS. 3A and 3C it can be that connector wires 150A and 150B (see FIG. 1A) are not present and that second and third extrusion monitors 145A and 145B are electrically connected to first extrusion monitor 120 by vias 155A1, 155A2, 155B1 and 155B2. In one example, second and third extrusion monitors 145A and 145B and vias 155A1, 155A2, 155B1 and 155B2 are damascene structures. In one example, second extrusion monitor 145A and vias 155A1, 155A2 are a dual damascene structure and third extrusion monitor 145B and vias 155B1, 155B2 are a dual damascene structure.

FIG. 4A is an exploded top view of the electrically conductive structures in each ILD layer of the extrusion monitor of FIGS. 3A, 3B, 3C and 3D. In FIG. 4A, it can be seen two vias are supplied for each of second and third extrusion monitors 145A and 145B, but any number from one via to as many vias as will fit may be used.

FIGS. 4B, 4C and 4D are top views of alternative constructions for a layer of the extrusion monitor illustrated in FIG. 4A. In FIG. 4B multiple vias 155C1 are substituted for vias 155A1 and 155A2 for second extrusion monitor 145A. There would be corresponding multiple vias or via bars associated with third extrusion monitor 145B. In FIG. 4C via bars 155D1 and D2 are substituted for vias 155A1 and 155A2 for second extrusion monitor 145A. There would be a corresponding pair of via bars associated with third extrusion monitor 145B. In FIG. 4D, a U-shaped via 155E is substituted for vias 155A1 and 155A2 for second extrusion monitor 145A. There would be a corresponding U-shaped via associated with third extrusion monitor 145B. In the alternatives illustrated in FIGS. 4B, 4C and 4B, the structures may be damascene or dual-damascene. The structures illustrated in FIGS. 4B, 4C and 4D provide more monitor area for a potential extrusion to contact.

Figure 5A:
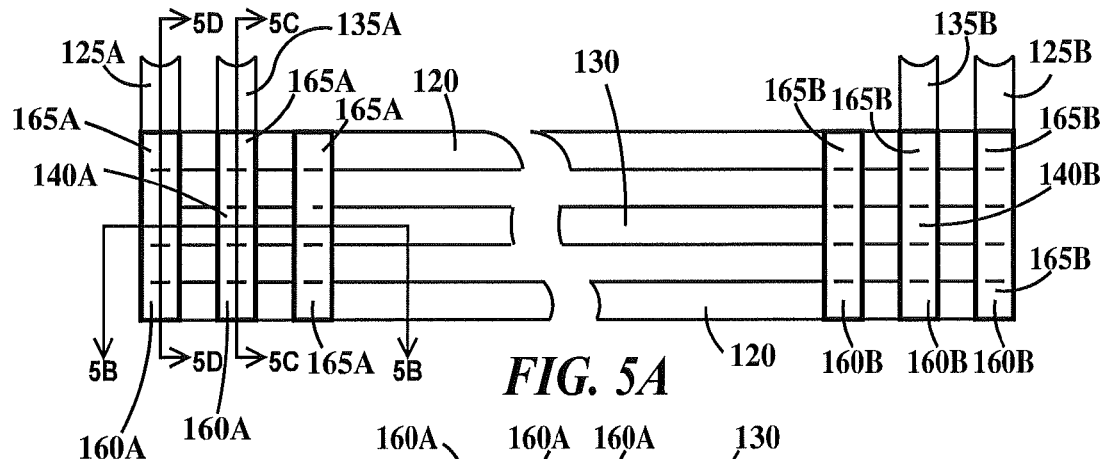
FIG. 5A is a top view and FIGS. 5B, 5C and 5D are cross sectional views through respective lines 5B-5B, 5C-5C and 5D-5D of an extrusion monitor structure according to a second embodiment of the present invention.
Figure 5B:
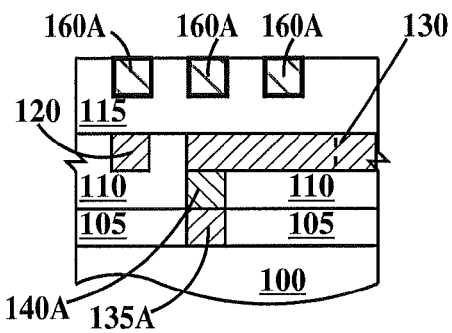
Figure 5C:
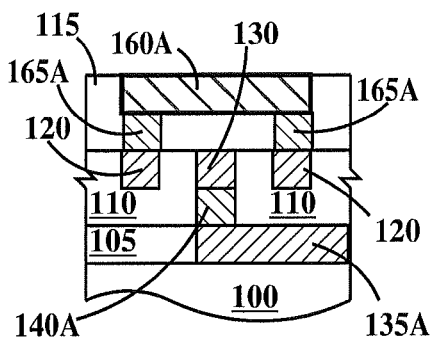
Figure 5D:
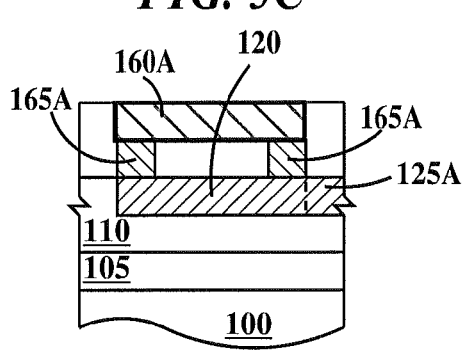
Figure 6:
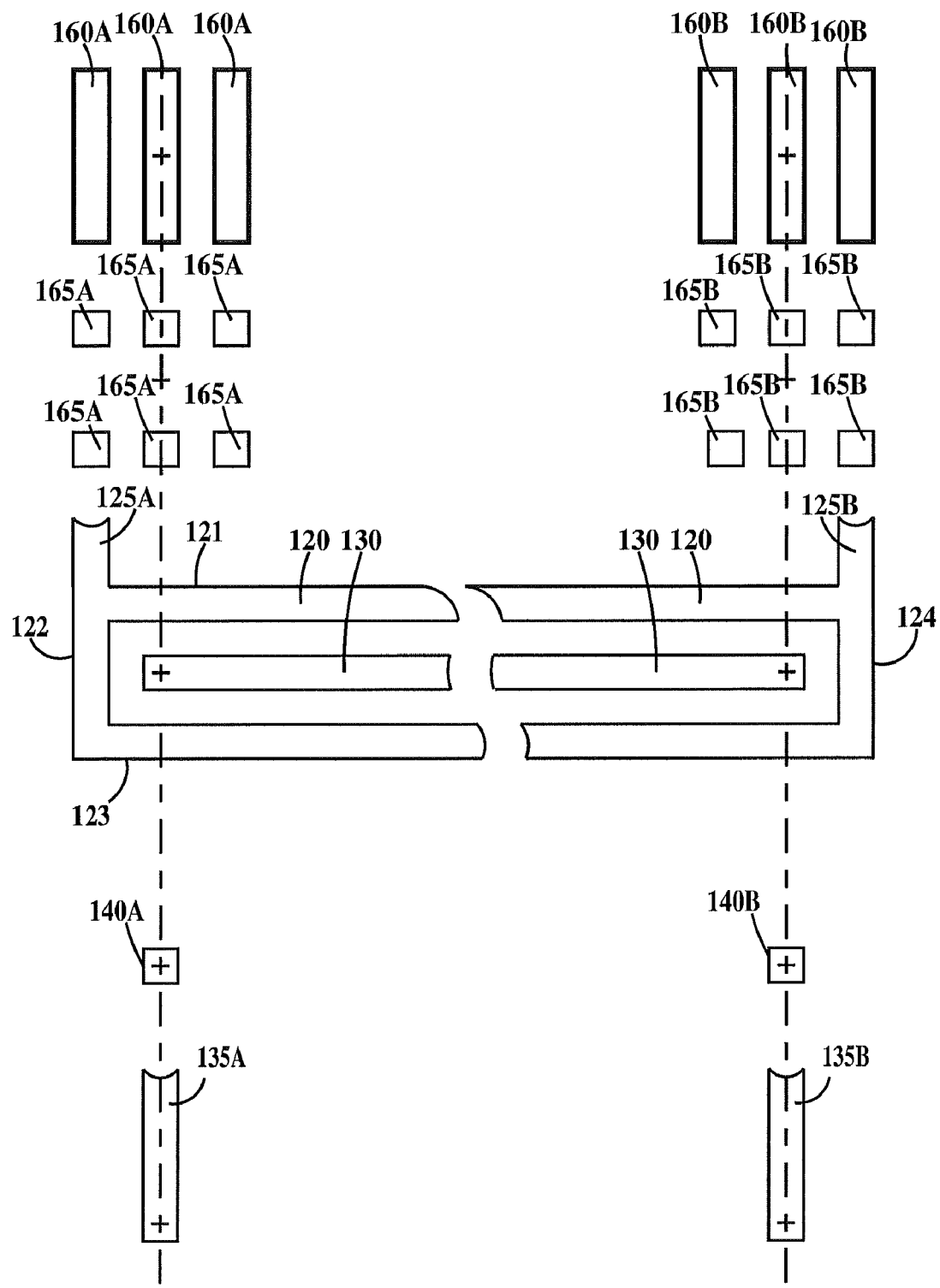
FIG. 6 is an exploded top view of the electrically conductive structures in each ILD layer of the extrusion monitor of FIGS. 5A, 5B, 5C and 5D.

FIG. 5A is a top view and FIGS. 5B, 5C and 5D are cross sectional views through respective lines 5B-5B, 5C-5C and 5D-5D of an extrusion monitor structure according to a second embodiment of the present invention and FIG. 6 is an exploded top view of the electrically conductive structures in each ILD layer of the extrusion monitor of FIGS. 5A, 5B, 5C and 5D. In FIGS. 5A, 5B, 5C, 5D and 6, second and third extrusion monitors 145A and 145B (see FIG. 1A) which were essentially plates, are replaced with respective multiple extrusion monitor bars 160A and 160B located over opposite ends of electromigration test wire 130. Each bar 160A is electrically connected to first extrusion monitor 120 by at least one via 165A (though two are shown, one at each end of each bar 160A) only one via 165A to each extrusion monitor bar 160A will suffice. Each extrusion monitor bar 160B is electrically connected to first extrusion monitor 120 by at least one via 165B (though two are shown, one at each end of each extrusion monitor bar 160B) only one via 165B to each extrusion monitor bar 160B will suffice. Further, via bars 155D1 and 155D2 of FIG. 4C or U-shaped via bar 155E of FIG. 4D may be substituted for vias 165A (or 165B). Extrusion monitor bars 160A and vias 165A (or via bars 155D1 and 155D2, or U-shaped via bar 155E) may be damascene or dual damascene structures. Extrusion monitor bars 160A and 160B and associated vias may comprise any of the materials described supra for second and third extrusion monitors 145A and 145B.

The use of bars instead of plates has the advantageous of allowing optical inspection of the underlying electromigration test wire during failure analysis and of more closely duplicating actual wiring of functional circuits thus providing more accurate failure data.

Figure 7A:
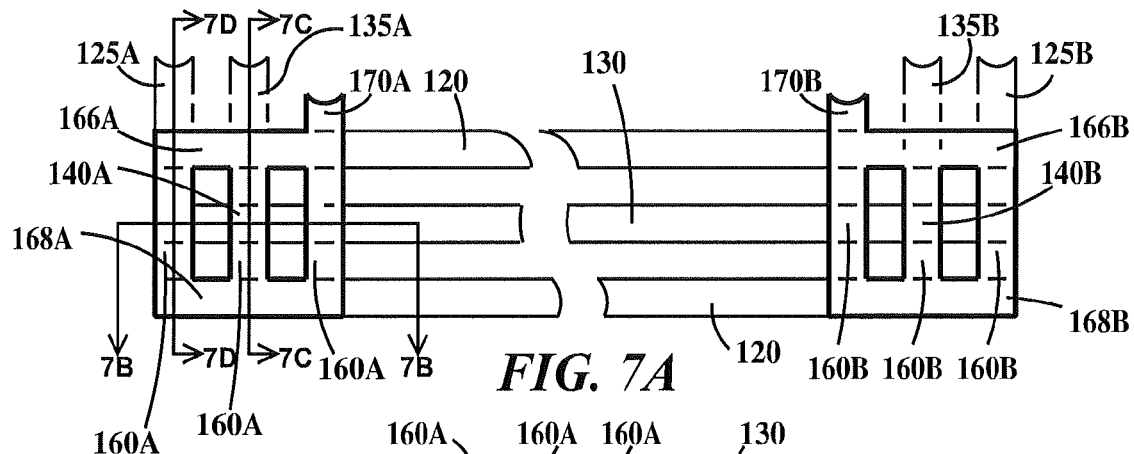
FIG. 7A is a top view and FIGS. 7B, 7C and 7D are cross sectional views through respective lines 7B-7B, 7C-7C and 7D-7D of an alternative wiring scheme for the extrusion monitor structure according to a second embodiment of the present invention.
Figure 7B:
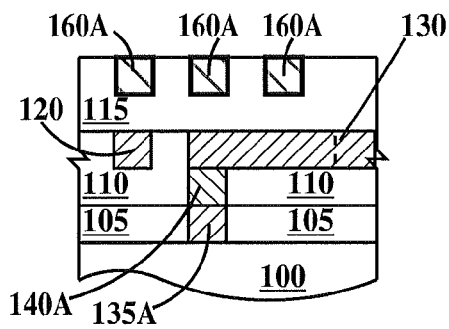
Figure 7C:
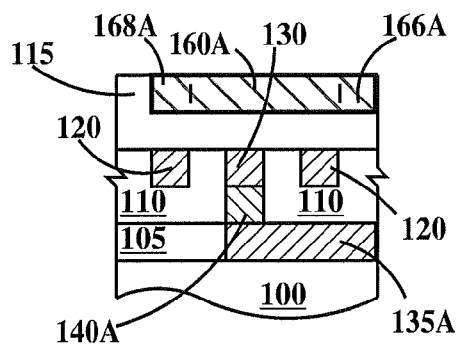
Figure 7D:
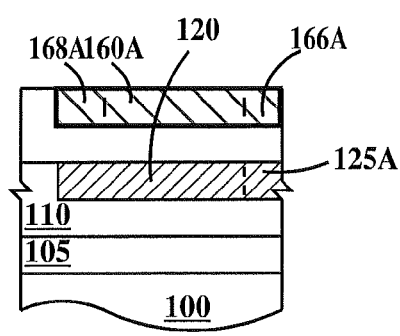
Figure 8:
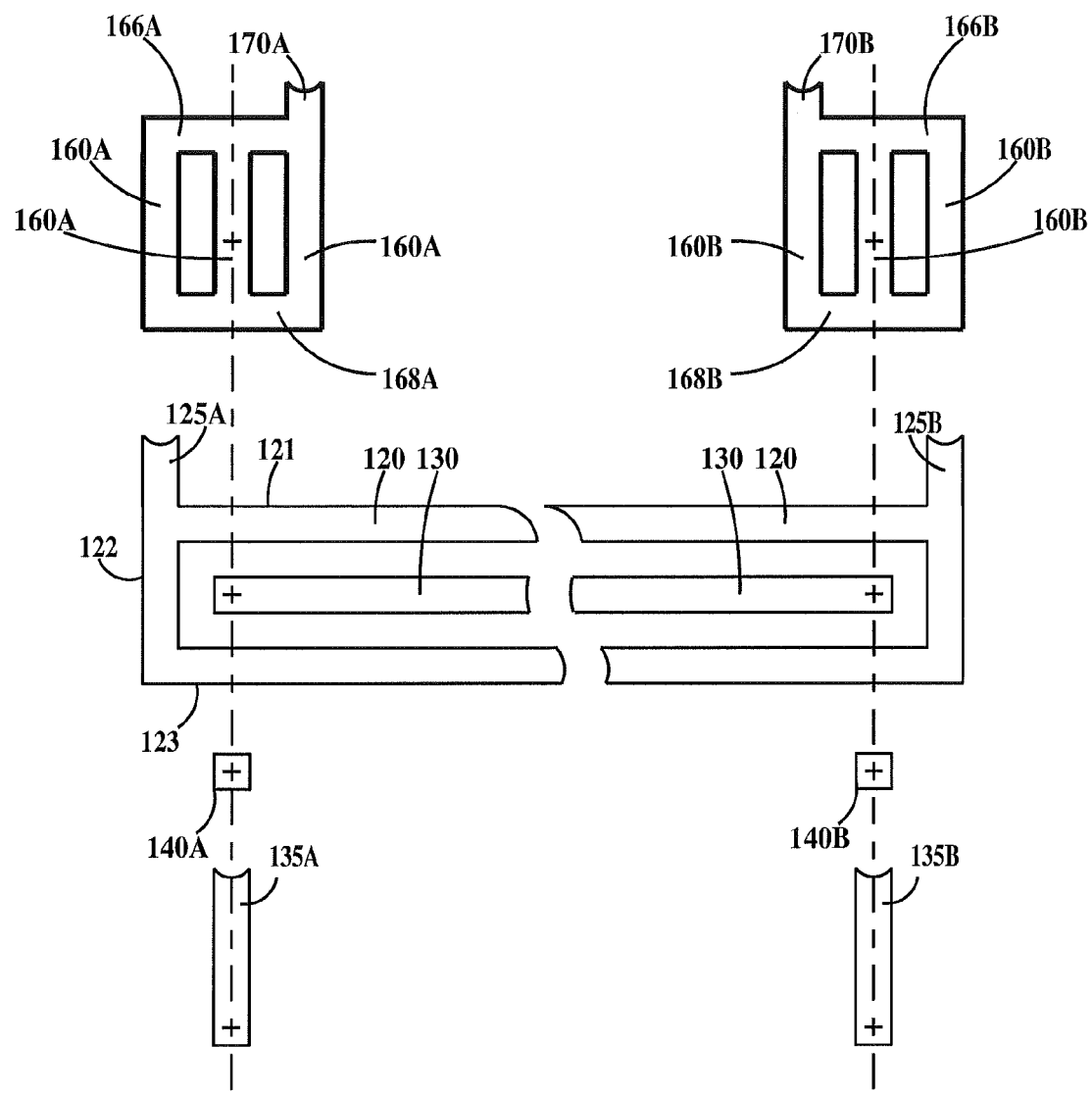
FIG. 8 is an exploded top view of the electrically conductive structures in each ILD layer of the extrusion monitor of FIGS. 7A, 7B, 7C and 7D.

FIG. 7A is a top view and FIGS. 7B, 7C and 7D are cross sectional views through respective lines 7B-7B, 7C-7C and 7D-7D of an alternative wiring scheme for the extrusion monitor structure according to a second embodiment of the present invention and FIG. 8 is an exploded top view of the electrically conductive structures in each ILD layer of the extrusion monitor of FIGS. 7A, 7B, 7C and 7D. In FIGS. 7A, 7B, 7C, 7D and 8, vias 165A and 165B of FIGS. 5A, 5B, 5C, 5D and 6 have been replaced with an integrally formed wires 166A and 168A and connection wire 170A connecting all extrusion monitor bars 160A and integrally formed wires 166B and 168B and connection wire 170B connecting all extrusion monitor bars 160B.

Figure 9:
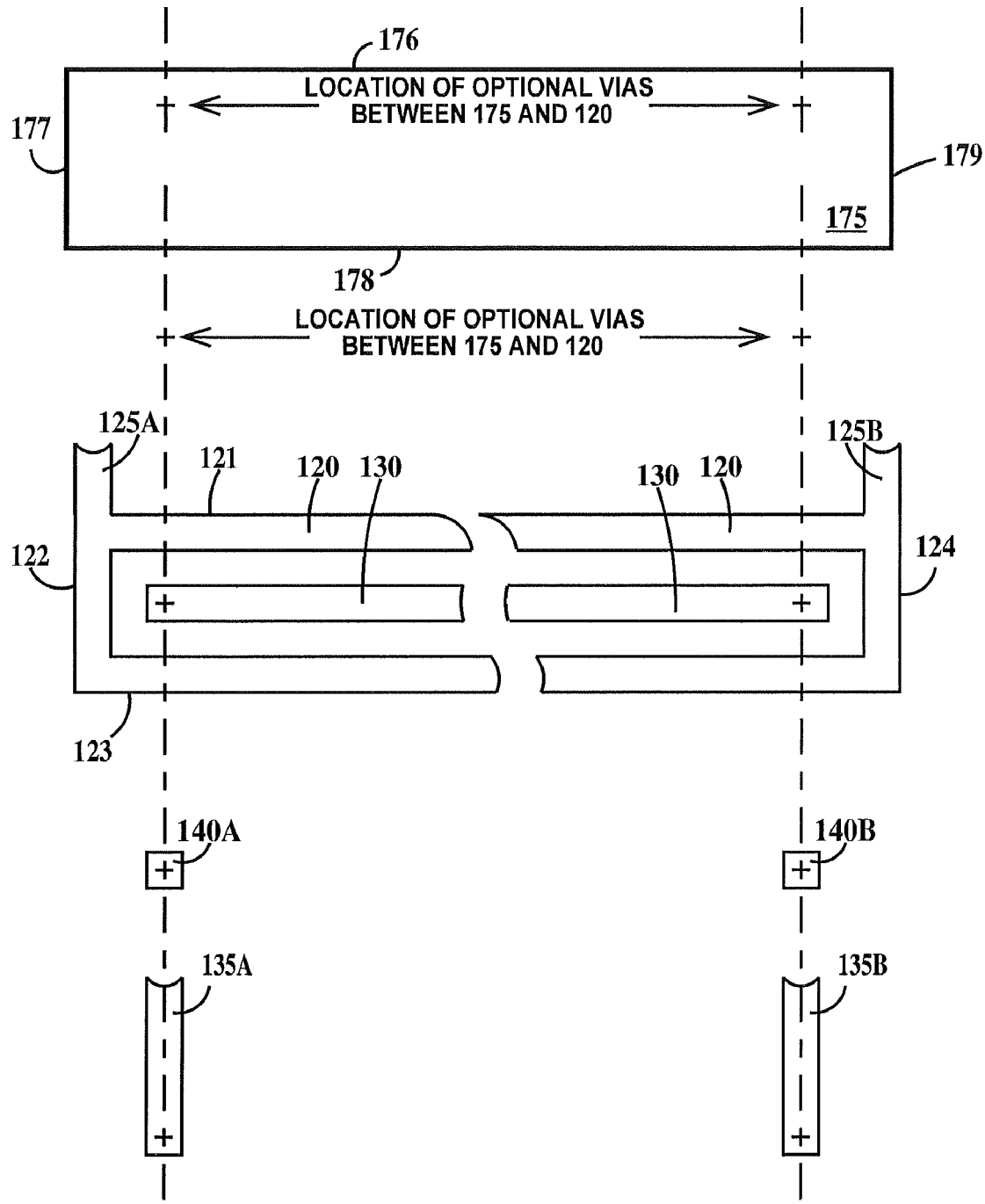
FIG. 9 is an exploded top view of the electrically conductive structures in each ILD layer of the extrusion monitor of a modified version of the first embodiment of the present invention.

FIG. 9 is an exploded top view of the electrically conductive structures in each ILD layer of the extrusion monitor of a modified version of the first embodiment of the present invention. FIG. 9 is similar to FIG. 4A except second and third extrusion monitors 145A and 145B are replaced by a single upper extrusion monitor 175 and the electrical connections to upper extrusion monitor plate 175 are not shown. Electrical connections to upper extrusion monitor plate 175 may be made using an integrally formed wire similar to wire 150A of FIG. 2 or by any of the via schemes illustrated in FIGS. 4B, 4C and 4D. The position of these connections is indicated in FIG. 9. Upper extrusion monitor plate 175 and associated vias (if any) may comprise any of the materials described supra for second and third extrusion monitors 145A and 145B. In one example, edges 176, 177, 178 and 179 of upper extrusion monitor plate 175 are aligned to respective edges 121, 122, 123 and 124 of first extrusion monitor 120. In the example of FIG. 9, upper extrusion monitor plate 175 completely overlays first extrusion monitor 120 and electromigration test wire 130 and when viewed from above.

Figure 10:
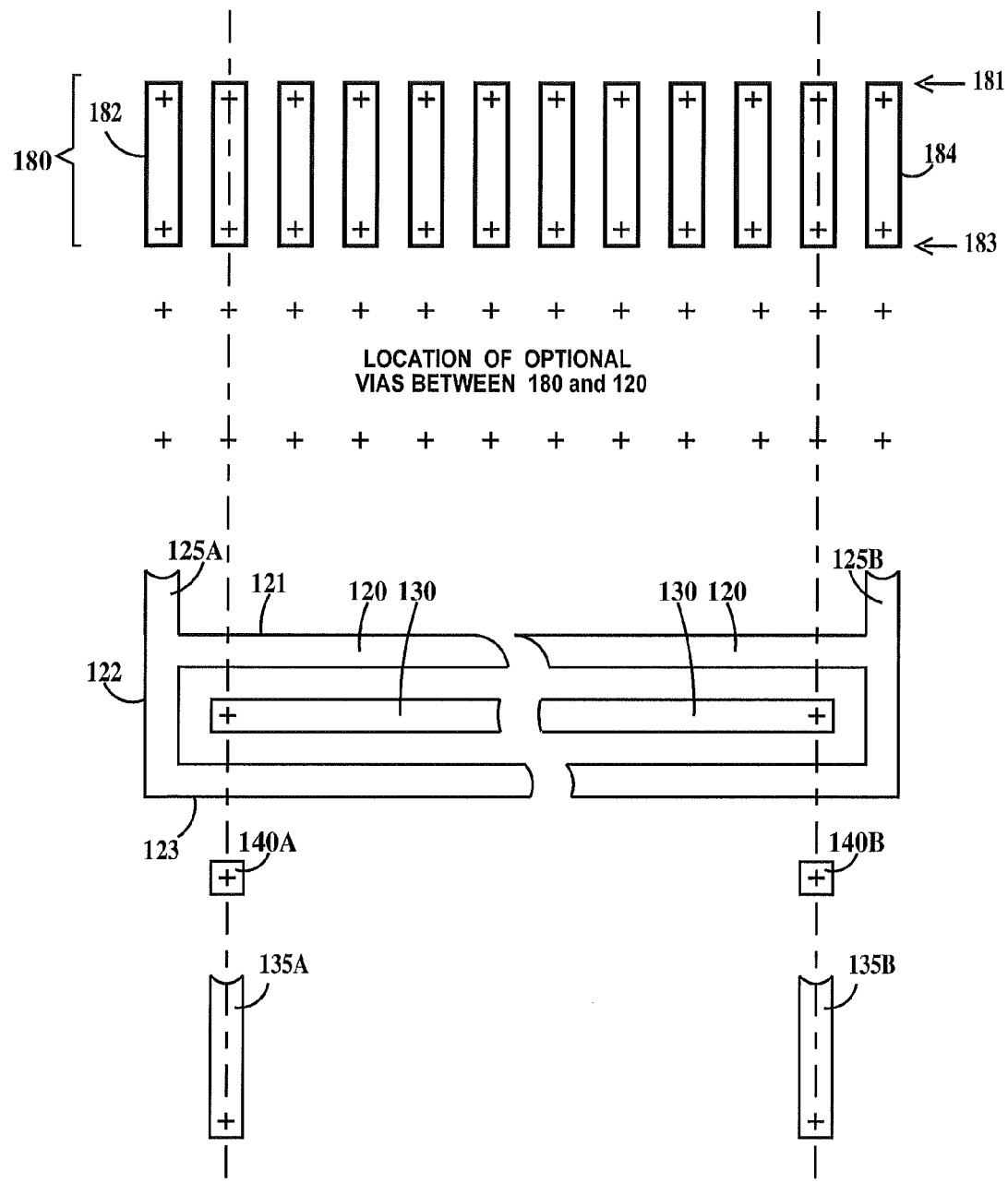
FIG. 10 is an exploded top view of the electrically conductive structures in each ILD layer of the extrusion monitor of a modified version of the second embodiment of the present invention.

FIG. 10 is an exploded top view of the electrically conductive structures in each ILD layer of the extrusion monitor of a modified version of the second embodiment of the present invention. FIG. 10 is similar to FIG. 6 except the two sets of multiple extrusion monitor bars 160A and 160B (see FIG. 6) are replaced by a single set of multiple upper extrusion monitor bars 180 and the electrical connections to each of the upper extrusion monitor bars are not shown. Electrical connections to the set of upper extrusion monitor bars 180 may be made using an integrally formed wire similar to wire 170A of FIG. 7A or by any of the via schemes illustrated in FIGS. 4B, 4C and 4D including placing a ring via similar to first extrusion monitor 120 between the first extrusion monitor and the set of upper extrusion monitor bars 180. The position of these connections is indicated in FIG. 10. The set of upper extrusion monitor bars 180 and associated vias (if any) may comprise any of the materials described supra for second and third extrusion monitors 145A and 145B. In one example, edges 181, 182, 183 and 184 of the set of upper extrusion monitor bars 180 are aligned to respective edges 121, 122, 123 and 124 of first extrusion monitor 120. In the example of FIG. 10, the perimeter of extrusion monitor bars 180 completely overlays first extrusion monitor 120 and electromigration test wire 130 and when viewed from above.

Figure 11:
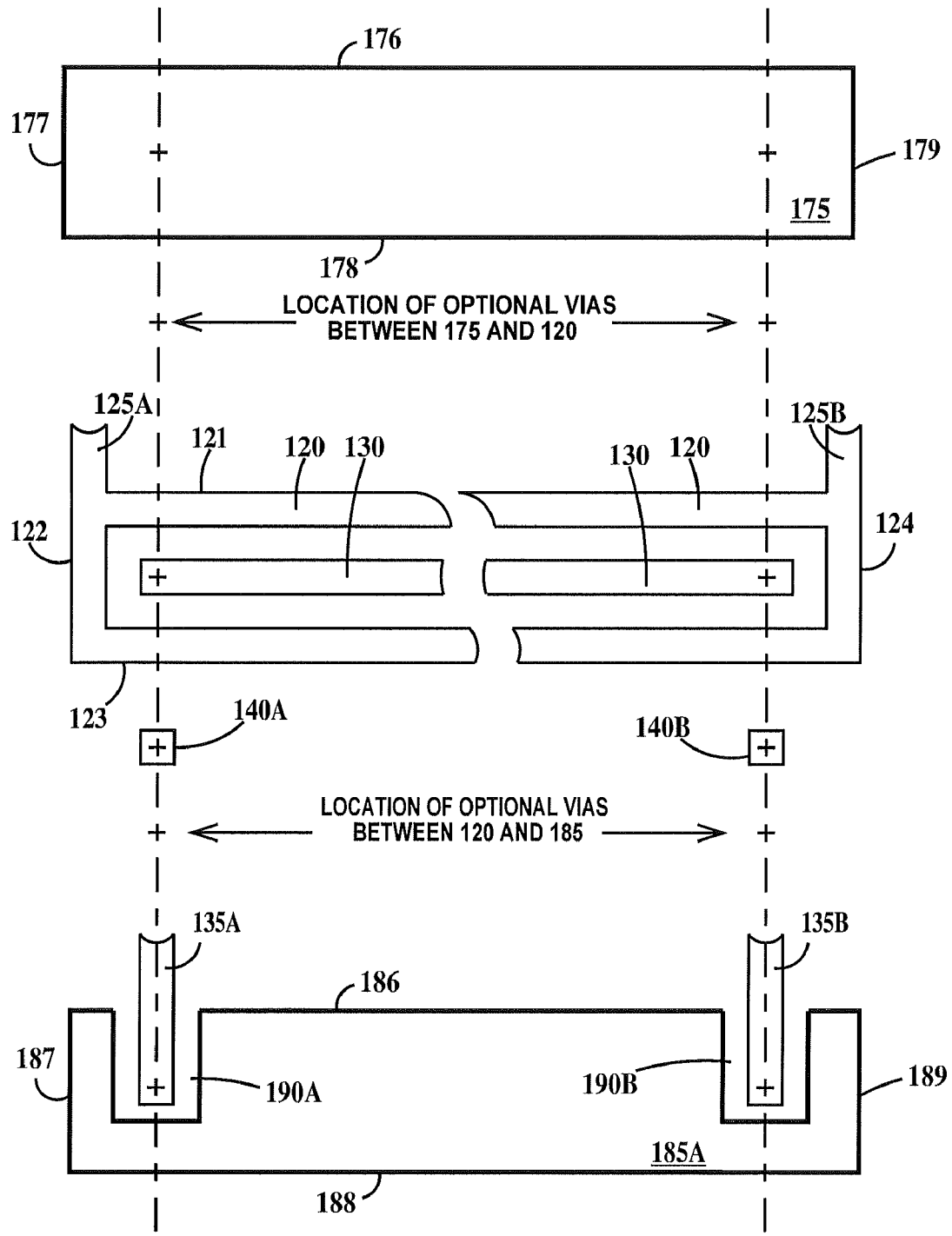
FIG. 11 is an exploded top view of the electrically conductive structures in each ILD layer of the extrusion monitor of another modified version of the first embodiment of the present invention.

FIG. 11 is an exploded top view of the electrically conductive structures in each ILD layer of the extrusion monitor of another modified version of the first embodiment of the present invention. FIG. 11 is similar to FIG. 9, except a lower extrusion monitor plate 185A is positioned under (but isolated from) electromigration test wire 130. Additionally slots 190A and 190B, are provided to allow electrical connection between wires 135A and 135B and vias 140A and 140B. Note wires 135A and 13B are now in the same wiring level as lower extrusion monitor plate 185A. Electrical connections to lower extrusion monitor plate 185A may be made using an integrally formed wire similar to wire 150A of FIG. 2 or by any of the via schemes illustrated in FIGS. 4B, 4C and 4D. The position of these connections to lower extrusion monitor plate 185A is indicated in FIG. 11. Lower extrusion monitor plate 185A and associated vias (if any) may comprise any of the materials described supra for second and third extrusion monitors 145A and 145B. In one example, edges 186, 187, 188 and 189 of lower extrusion monitor plate 185A are aligned to respective edges 121, 122, 123 and 124 of first extrusion monitor 120. In the example of FIG. 11, upper extrusion monitor plate 175 completely overlays first extrusion monitor 120 and electromigration test wire 130 and lower extrusion monitor plate 185A when viewed from above.

Figure 12:
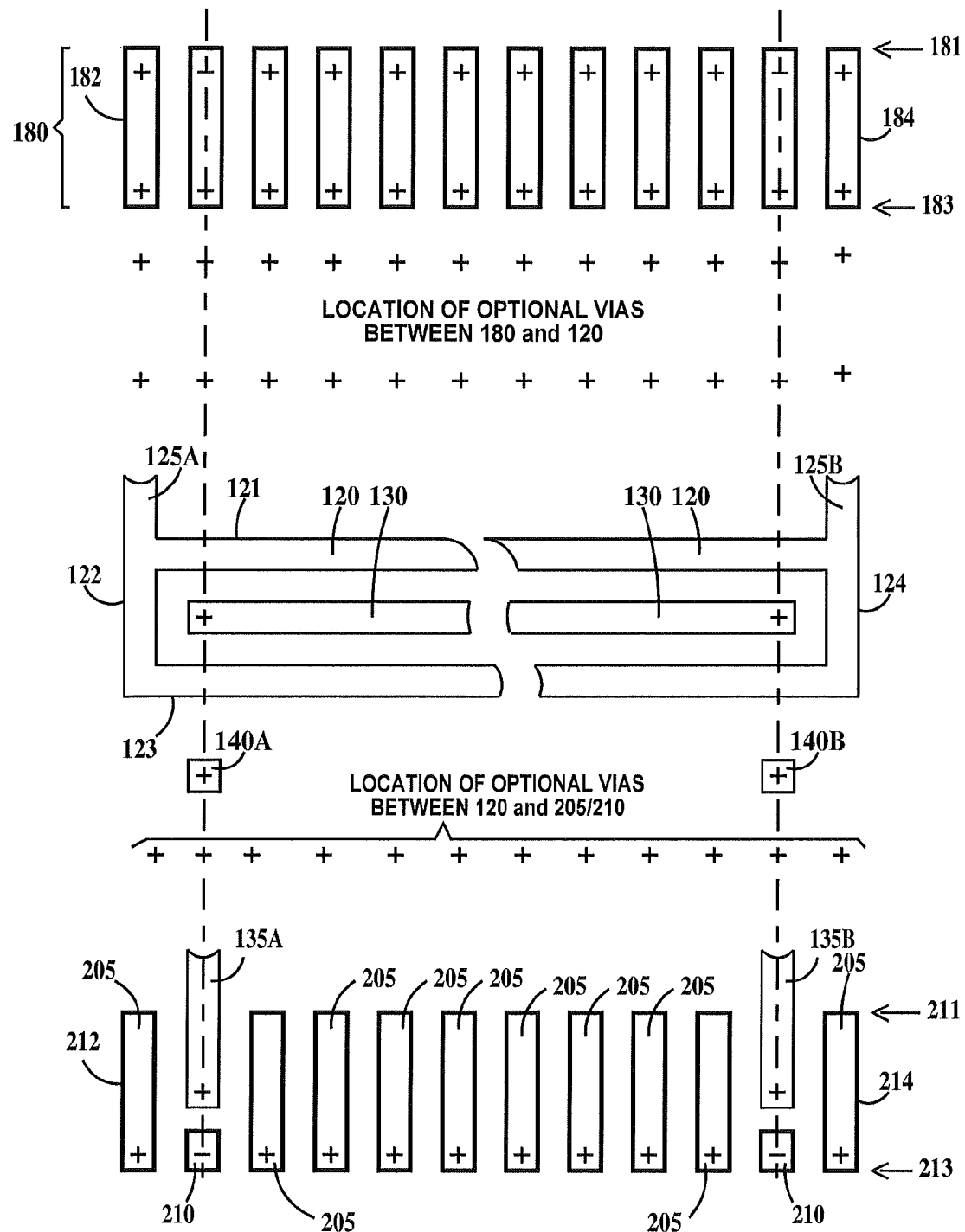
FIG. 12 is an exploded top view of the electrically conductive structures in each ILD layer of the extrusion monitor of another modified version of the second embodiment of the present invention.

FIG. 12 is an exploded top view of the electrically conductive structures in each ILD layer of the extrusion monitor of another modified version of the second embodiment of the present invention. FIG. 12 is similar to FIG. 11, except a set of multiple lower extrusion monitor bars 205 and 210 are positioned under (but isolated from) electromigration test wire 130. Note wires 135A and 135B are now in the same wiring level as lower extrusion monitor bars 205 and 210. Electrical connections to the set of multiple lower extrusion monitor bars 205 and 210 may be made using an integrally formed wire similar to wire 150A of FIG. 2 or by any of the via schemes illustrated in FIGS. 4B, 4C and 4D. The position of these connections to the set of multiple lower extrusion monitor bars 205 and 210 is indicated in FIG. 12. The set of multiple lower extrusion monitor bars 205 and 210 and associated vias (if any) may comprise any of the materials described supra for second and third extrusion monitors 145A and 145B. In one example, edges 211, 212, 213 and 214 of the set of multiple lower extrusion monitor bars 205 and 210 are aligned to respective edges 121, 122, 123 and 124 of first extrusion monitor 120. In the example of FIG. 12, the perimeter of extrusion monitor bars 180 completely overlays first extrusion monitor 120, electromigration test wire 130 and lower extrusion monitor bars 205 and 210 when viewed from above.

Figure 13A:
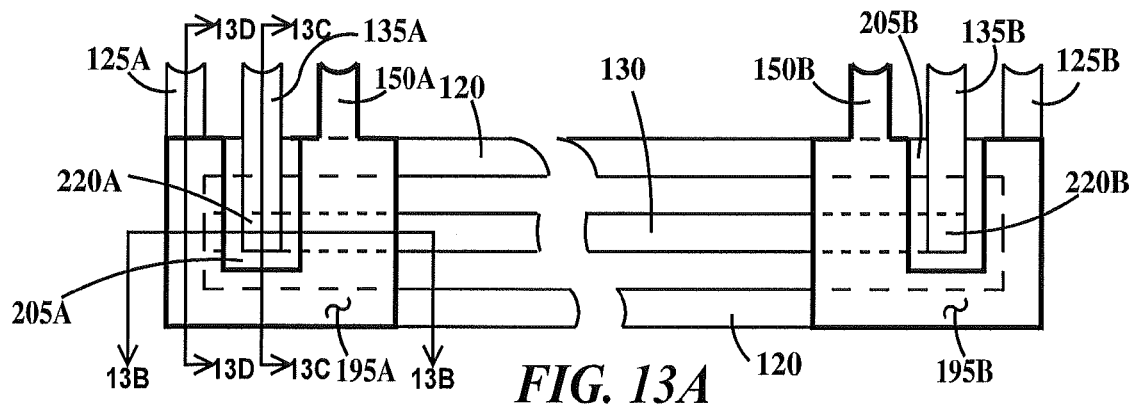
FIG. 13A is a top view and FIGS. 13B, 13C and 13D are cross sectional views through respective lines 13B-13B, 13C-13C and 13D-13D of an extrusion monitor structure according to alternative wiring schemes of the present invention.
Figure 13B:
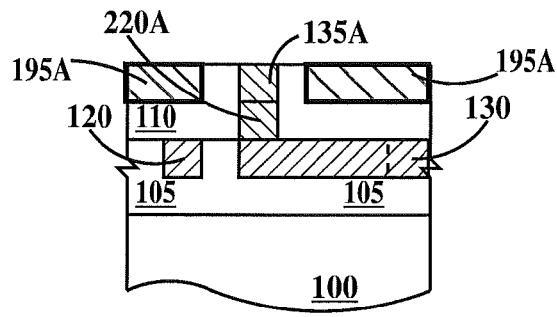
Figure 13C:
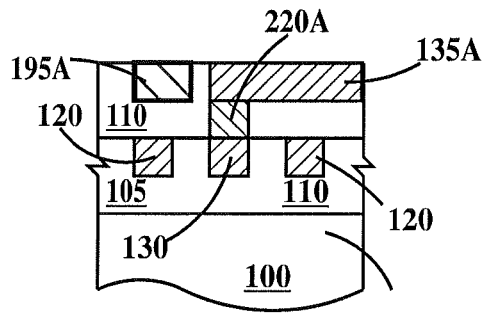
Figure 13D:
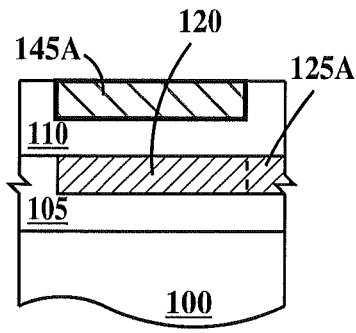
Figure 14:
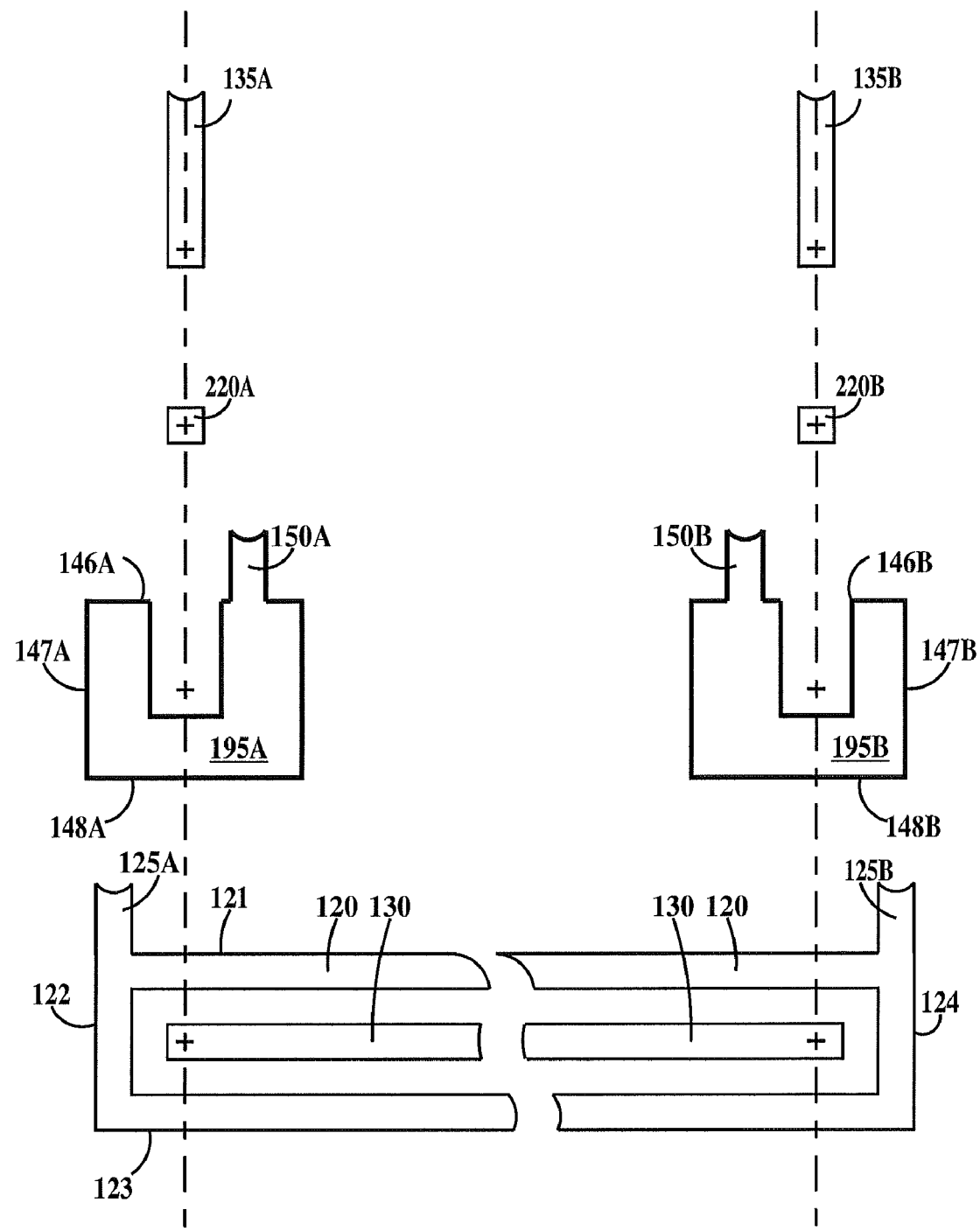
FIG. 14 is an exploded top view of the electrically conductive structures in each ILD layer of the extrusion monitor of FIGS. 13A, 13B, 13C and 13D.

FIG. 13A is a top view and FIGS. 13B, 13C and 13D are cross sectional views through respective lines 13B-13B, 13C-13C and 13D-13D of an extrusion monitor structure according to alternative wiring schemes of the present invention and FIG. 14 is an exploded top view of the electrically conductive structures in each ILD layer of the extrusion monitor of FIGS. 13A, 13B, 13C and 13D. FIGS. 13A, 13B, 13C, 13D and 14, are similar to FIGS. 1A, 1B, 1C, 1D and 2 except second and third extrusion monitor structures 145A and 145B have been replaced with are second and third extrusion monitor structures 195A and 195B having respective slots 205A and 205B in order to allow wires 135A and 135B to be formed in the same wiring level as second and third extrusion monitor structures 195A and 195B. Note, the dielectric layers that the various conductive elements are formed in are now one level closer to substrate 100. The principle of wiring scheme illustrated (i.e. contact to electromigration test wire 130 through vias 220A and 220B from above rather than from below) in FIGS. 13A, 13B, 13C, 13D and 14 may be applied to any of the embodiments of the present invention. For the embodiments of FIGS. 11 and 12, the geometry of upper and lower extrusion monitor structures are swapped.

Thus, the embodiments of the present invention provide extrusion monitors that can detect vertical as well as lateral extrusions.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. For example, the combinations of the various extrusion monitor structures may be used together in conjunction with a single electromigration test wire. For example, the various extrusion monitor structures illustrated as over the electromigration test wire may be placed under or both over and under the electromigration test wire in any combination. For example, a first via at a first end of an electromigration wire may physically and electrically contact a bottom surface of the wire, while a second via at a second end of the wire may physically and electrically contact a top surface of the wire. Therefore, it is intended that the following claims cover all such modifications and changes as fall within the true spirit and scope of the invention.

What is claimed is:

1. A structure, comprising:

an electrically conductive test wire in a first dielectric layer, said first dielectric layer over a top surface of a substrate, a bottom surface of said test wire facing said top surface of said substrate, said test wire having first and second ends, a top surface of said test wire opposite said bottom surface of said test wire;

an electrically conductive ring-shaped first monitor structure in said first dielectric layer, a bottom surface of said first monitor structure facing said top surface of said substrate, said first monitor structure electrically isolated from said test wire, said first monitor structure surrounding a perimeter of said test wire;

an electrically conductive second monitor structure in a second dielectric layer, said second dielectric layer on a top surface of said first dielectric layer, a bottom surface of said second monitor structure facing a top surface of said test wire, said second monitor structure electrically isolated from said test wire, said second monitor structure extending over said first end of said test wire; and an electrically conductive first via contacting said first end of said test wire and an electrically conductive second via electrically contacting said second end.

2. The structure of claim 1, further including:
an electrically conductive third monitor structure in said second dielectric layer, a bottom surface of said third monitor structure facing said top surface of said test wire, said third monitor structure electrically isolated from said test wire, said third monitor structure extending over said second end of said test wire.

3. The structure of claim 2, further including:
an electrically conductive fourth monitor structure formed in a third dielectric layer under said first dielectric layer, a top surface of said fourth monitor structure facing a bottom surface of said test wire, said fourth monitor structure electrically isolated from said test wire, said fourth monitor structure (i) extending over said first end or (ii) extending entirely over said test wire.

4. The structure of claim 3, wherein said fourth monitor structure is (i) a plate under regions of said first monitor structure proximate to said first via or (ii) said fourth monitor structure comprises spaced apart parallel bars extending in a direction perpendicular to an axis extending through said first and second ends of said test wire, said parallel bars extending under regions of said first monitor structure proximate to said first via.

5. The structure of claim 1, wherein said second monitor structure is (i) a plate extending over regions of said first monitor structure proximate to said first via or (ii) said second monitor structure comprises spaced apart bars extending in a direction transverse to an axis extending through said first and second ends of said test wire, said bars extending over regions of said first monitor structure proximate to said first via.

6. The structure of claim 1, wherein said second monitor structure extends from said first end to said second end of said test wire.

7. The structure of claim 6, wherein said second monitor structure is (i) a plate over regions of said first monitor structure proximate to said first via and proximate to said second via or (ii) said second monitor structure comprises spaced apart bars extending in a direction transverse to an axis extending through said first and second ends of said test wire, said bars extending over regions of said first monitor structure proximate to said first via.

8. The structure of claim 1, wherein (i) said test wire is a damascene wire or (ii) said test wire is a dual damascene wire and first and second vias are integrally formed with said test wire.

9. The structure of claim 1, wherein said test wire and first and second monitor structures each independently comprise Al, Ag, Au, Cu, alloys of Al, alloys of Ag, alloys of Au, alloys of Cu, Ta, TaN, Ti, TiN or combinations thereof.

10. The structure of claim 1, wherein said first and second vias are either (i) located between said top surface of said substrate and said test wire, said first via physically and electrically contacting said bottom surface of said test wire at said first end and said second via physically and electrically contacting said bottom surface of said test wire at said second end or (ii) located between said test wire and first and second monitor structures, said first via physically and electrically contacting said top surface of said test wire at said first end and said second via physically and electrically contacting said top surface of said test wire at said second end.

11. A method, comprising:
forming an electrically conductive test wire in a first dielectric layer, said first dielectric layer formed over a top surface of a substrate, a bottom surface of said test wire facing said top surface of said substrate, said test wire having first and second ends, a top surface of said test wire opposite said bottom surface of said test wire;
forming an electrically conductive ring-shaped first monitor structure in said first dielectric layer, a bottom surface of said first monitor structure facing said top surface of said substrate, said first monitor structure electrically isolated from said test wire, said first monitor structure surrounding a perimeter of said test wire;
forming an electrically conductive second monitor structure in a second dielectric layer, said second dielectric layer on a top surface of said first dielectric layer, a bottom surface of said second monitor structure facing a top surface of said test wire, said second monitor structure electrically isolated from said test wire, said second monitor structure extending over said first end of said test wire; and
forming an electrically conductive first via contacting said first end of said test wire and an electrically conductive second via electrically contacting said second end of said test wire.

12. The method of claim 11, further including:
forming an electrically conductive third monitor structure in second dielectric layer, a bottom surface of said third monitor structure facing said top surface of said test wire, said third monitor structure electrically isolated from said test wire, said third monitor structure extending over said second end of said test wire.

13. The method of claim 12, further including:
forming an electrically conductive fourth monitor structure in a third dielectric layer under said first dielectric layer, a top surface of said fourth monitor structure facing a bottom surface of said test wire, said fourth monitor structure electrically isolated from said test wire, said fourth monitor structure (i) extending over said first end or (ii) extending entirely over said test wire.

14. The method of claim 13, wherein said fourth monitor structure is (i) a plate under regions of said first monitor structure proximate to said first via or (ii) said fourth monitor structure comprises spaced apart parallel bars extending in a direction perpendicular to an axis extending through said first and second ends of said test wire, said parallel bars extending under regions of said first monitor structure proximate to said first via.

15. The method of claim 11, wherein said second monitor structure is (i) a plate extending over regions of said first monitor structure proximate to said first via or (ii) said second monitor structure comprises spaced apart bars extending in a direction transverse to an axis extending through said first and second ends of said test wire, said bars extending over regions of said first monitor structure proximate to said first via.

16. The method of claim 11, wherein said second monitor structure extends from said first end to said second end of said test wire.

17. The method of claim 16, wherein said second monitor structure is (i) a plate over regions of said first monitor structure proximate to said first via and proximate to said second via or (ii) said second monitor structure comprises spaced apart bars extending in a direction transverse to an axis extending through said first and second ends of said test wire, said parallel bars extending over regions of said first monitor structure proximate to said first via.

18. The method of claim 11, wherein (i) said test wire is a damascene wire or (ii) said test wire is a dual damascene wire and first and second vias are integrally formed with said test wire.

19. The method of claim 11, wherein said test wire and said first and second monitor structures each independently comprise Al, Ag, Au, Cu, alloys of Al, alloys of Ag, alloys of Au, alloys of Cu, Ta, TaN, Ti, TiN or combinations thereof.

20. The method of claim 11, wherein said first and second vias are either (i) located between said top surface of said substrate and said test wire, said first via physically and electrically contacting said bottom surface of said test wire at said first end and said second via physically and electrically contacting said bottom surface of said test wire at said second end or (ii) located between said test wire and first and second monitor structures, said first via physically and electrically contacting said top surface of said test wire at said first end and said second via physically and electrically contacting said top surface of said test wire at said second end.

* * * * *